United States Patent [19]

Corbero

[11] 4,215,272

[45] Jul. 29, 1980

[54] TIMER CIRCUIT WITH MULTIPLE TIME DELAY OUTPUTS

[75] Inventor: Paul A. Corbero, Minneapolis, Minn.

[73] Assignee: Honeywell Inc., Minneapolis, Minn.

[21] Appl. No.: 936,940

[22] Filed: Aug. 25, 1978

[51] Int. Cl.² ............................................. H03K 5/13
[52] U.S. Cl. .................................. 250/293; 250/265; 250/274
[58] Field of Search ............... 307/293, 265, 268, 274; 331/111; 250/293, 265, 268, 274

[56] References Cited

U.S. PATENT DOCUMENTS

| 3,131,318 | 4/1964 | Snyder | 307/293 |
| 3,162,772 | 12/1964 | Smith | 307/293 |
| 3,657,564 | 4/1972 | Hollis | 307/265 |

*Primary Examiner*—Harold A. Dixon
*Attorney, Agent, or Firm*—Laurence J. Marhoefer; Lockwood D. Burton; Mitchell J. Halista

[57] ABSTRACT

A timer circuit is powered by an alternating current (AC) from an AC source which current is rectified to produce direct current (DC) and used to energize a power transistor connected between the DC source and in a load. A separate timing control circuit responds to a selected one of a plurality of AC input signals to provide multiple time delay control signals for initially actuating the power transistor to provide a current flow to the load and, subsequently for turning off the power transistor. The timing circuit uses a controlled charging of a timing capacitor to trigger a unijunction transistor into conduction. The unijunction transistor, in turn, develops an output voltage for actuating an SCR. The SCR is connected with its current conducting path across the load, e.g., across a relay coil, and is used to short-circuit the relay coil when the SCR is actuated into conduction. The selected input AC signal initiates the conducting state of the power transistor and terminates the conducting state of the power transistor by removing an actuating signal for the power transistor which also allows the SCR to turn-off to return the load circuit to its normal, or initial, state.

4 Claims, 1 Drawing Figure

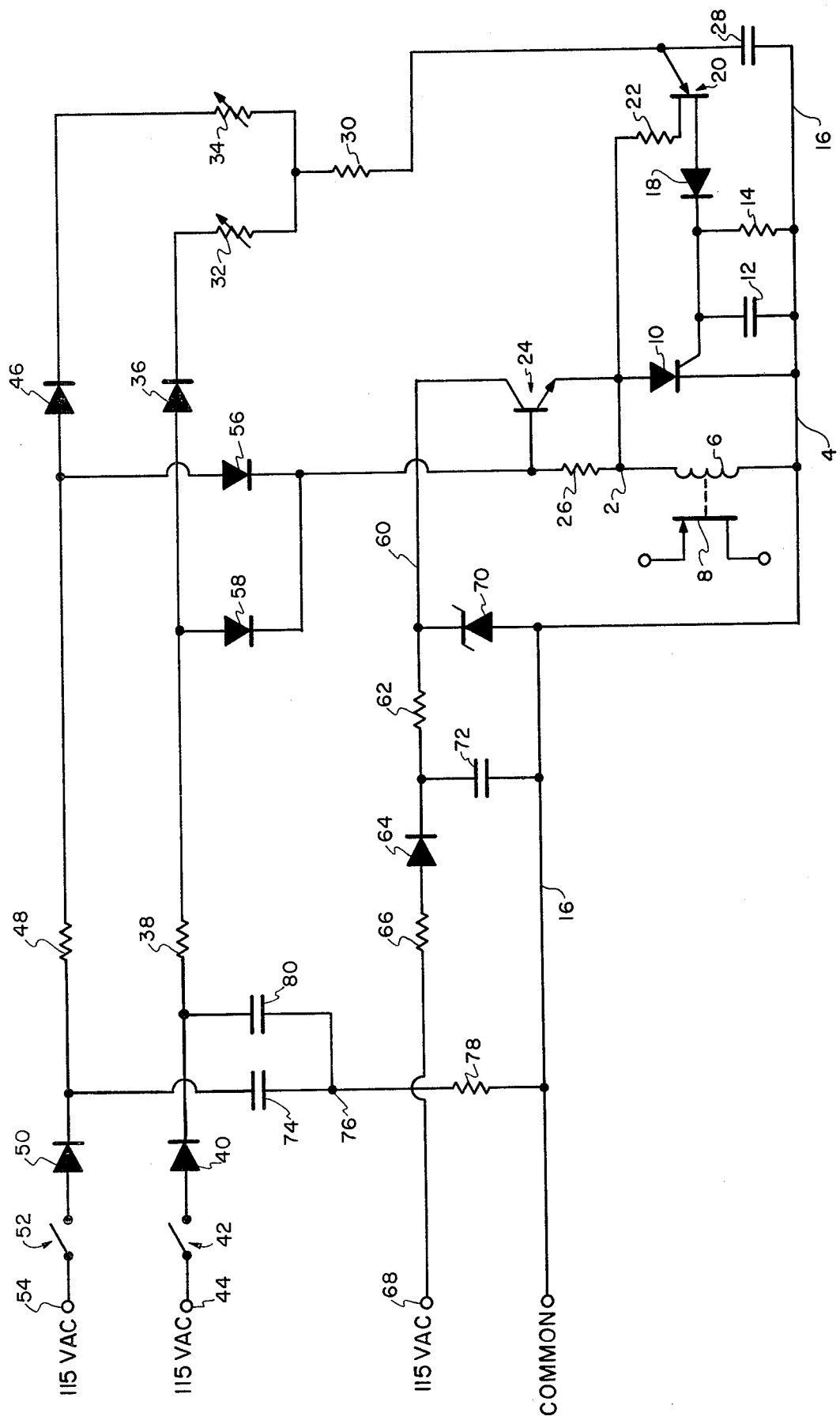

TIMER CIRCUIT WITH MULTIPLE TIME DELAY OUTPUTS

BACKGROUND OF THE INVENTION

1. Field Of The Invention

The present invention is directed to timer circuits. More specifically, the present invention relates to timer circuits having multiple time delay outputs.

SUMMARY OF THE INVENTION

An object of the present invention is to provide an improved timer circuit having multiple time delay output signals.

In accomplishing this and other objects, there has been provided, in accordance with the present invention a timer circuit having an output load circuit, an input energizing signal circuit, a current control means connected between the load circuit and the energizing signal circuit, control signal input means arranged to apply an actuating signal to the current control means and to start a time period measuring means and current bypass means connected across the load circuit with the time period measuring means being arranged to actuate the current bypass means to provide a path for a current through said current bypass means in parallel with the output load circuit means.

DESCRIPTION OF THE DRAWINGS

A better understanding of the present invention may be had when the following detailed description is read in connection with the accompanying drawings in which the single FIGURE is a schematic illustration of an example of a timer circuit embodying the present invention.

DESCRIPTION OF THE PREFERRED EMBODIMENT

Detailed Description

Referring to the single FIGURE drawing in more detail, there is shown a multiple time delay timer circuit embodying an example of the present invention and being used to control the current flow between a pair of load circuit terminals 2 and 4. In the example shown in the single FIGURE drawing, a relay coil 6 is connected across the load terminals 2, 4 and is arranged to control a relay contact 8. If the relay contact 8 is a normally closed (NC) contact used to allow an associated circuit (not shown) to operate, the energization of the relay coil 6 would be effective to open the relay contact 8 to provide an inhibit mode of operation for the associated circuit. The duration of the open and closed times of the relay contact 8 is determined by the periods of energization and de-energization of the relay coil 6, respectively, produced by the timer circuit of the present invention.

An SCR 10 is connected with its current conducting path electrodes across the relay coil 6. A control electrode of the SCR 10 is connected to one side of a capacitor 12 and a resistor 14. The other side of the capacitor 12 and the resistor 14 are connected to an AC common return line 16. The control electrode of the SCR 10 is also connected by a diode 18 to a current conducting electrode of a unijunction transistor 20. A second current conducting electrode of the unijunction transistor 20 is connected through a resistor 22 to an emitter electrode of a current control transistor 24 and to the base electrode of the current control transistor 24 through a resistor 26. A control electrode of the unijunction transistor 20 is connected through a timing capacitor 28 to the AC common line 16 and through a resistor 30 to one side of a pair of time delay control variable resistor 32 and 34.

The other side of the variable resistor 32 is connected through a series combination of a diode 36, a resistor 38 and a diode 40 to one side of a single-pole, single-throw switch 42. The other side of the switch 42 is connected to a source of an AC signal (not shown) connected to a first AC input terminal 44. Similarly, the other side of the resistor 34 is connected through a series combination of a diode 46, a resistor 48 and a diode 50 to one side of a second single-pole, single-throw switch 52. The other side of the switch 52 is connected to a second AC input terminal 54. The junction between the diode 46 and the resistor 48 is connected by a diode 56 to the base of the current control transistor 24. Similarly, the junction between the diode 36 and the resistor 38 is connected by a diode 58 to the base of the transistor 24. The collector of the transistor 24 is connected to a direct current (DC) supply line 60. The DC supply line 60 is connected to through a series combination of a resistor 62, a diode 64 and a resistor 66 to an AC power input terminal 68. A Zener diode 70 is connected between the DC supply line 60 and the common line 16, and a filter capacitor 72 is connected between the junction of the diode 64 and the resistor 62 to the common line 16. A filter capacitor 74 is connected between the junction of the diode 50 and the resistor 48 and a circuit junction 76. Similarly, a filter capacitor 80 is connected between the junction of the diode 40 and the resistor 38 and the circuit junction 76. A resistor 78 is arranged to connect the junction 76 to the common line 16.

MODE OF OPERATION

In operation, the multiple delay timer circuit shown in the single FIGURE drawing is powered by an AC energizing signal and is selectively actuated by an AC input signal applied selectively by switches 42, 52. While the number of switches 42, 52 and associated circuitry extending to the variable resistors 32, 34 is shown in the single FIGURE drawing as two similar circuits, it should be noted that the number of such circuits may be modified whereby the number of switches and associated circuitry may be increased or decreased with respect to the illustrated number. Assuming, that in the initial state of the timer circuir the relay coil 6 is de-energized, and that the relay switch 8 is a normally closed relay contact, then the single FIGURE illustration illustrates the condition of the relay circuit before the energization of the relay coil 6.

The timer circuit is divided into two operative sections with each section being AC powered. A first section includes an AC powered rectifier circuit supplying an energizing DC signal to the collector-emitter path of the current control transistor 24. This section of the timer circuit includes the resistors 62, 66, the recitifier diode 64, the filter capacitor 72 and voltage control Zener diode 70. Accordingly, the current control transistor 24 is provided with an energizing DC voltage between its collector and its emitter electrodes. However, inasmuch as the base electrode of the transistor 24 is de-energized at this time, the transistor 24 is in a non-conducting state, and the relay coil 6 is de-energized.

The second section of the circuit is the input signal controlled timing circuitry including the input switches 42 and 52 and is also energized by an AC input signal applied to the terminals 44, 54. The AC signal is rectified by the rectifiers 40, 50 and filtered by filter capacitors 74, 80 to provide DC signals suitable for application to the base of the current control transistor 24 and to the timer control circuitry as hereinafter described. Accordingly, the operation of one of the switches 42, 50 is effective to apply a DC signal to the base of the transistor 24 to actuate the transistor 24 into a current conducting state. The resulting current flow through the transistor 24 is effective to energize the relay coil 6 and to open the relay contact 8.

The energized state of the relay coil 6 is maintained for a period of time as determined by the timing circuit of the present invention including the timing capacitor 28, the resistor 30 and the variable resistors 32, 34. The resistors 32, 34 are variable resistors in order to provide for adjustment of the timing delay afforded by a selection of either of the timing resistors 32, 34 by the input switches 42, 52. For example, assuming the input switch 42 is closed to select a timing control of the circuit of the present invention, the AC input signal applied to AC input terminal 44 is rectified by rectifier 40 and filtered by the capacitor 80. The resulting DC signal is applied through a diode 36 to the corresponding variable resistor 32. The selected variable resistor 32 in combination with the common resistor 30 determines the current supplied to the timing capacitor 28 to charge the timing capacitor 28.

When the timing capacitor 28 reaches the unijunction triggering potential of the unijunction transistor 20, the unijunction transistor 20 is triggered into conduction, and the timing capacitor 28 discharges through the diode 18 and the resistor 14. The resulting voltage developed across the resistor 14 is effective to turn on the SCR 10 and provide a short-circuit current path in parallel with the relay coil 6. The short-circuiting of the current around the relay coil 6 is effective to de-energize the relay coil and to restore the contact 8 to its normally closed state. The resistor 62 is provided for limiting the current through the transistor 24 during the conducting time of the SCR 10. Thus, the selected variable resistor 32 set the time during which the relay coil 6 was energized after the actuation of the input switch 42.

In order to restore the circuit to its initial state following the aforesaid energization and de-energization of the relay coil 10 by the timing circuit of the present invention, the input switch 42 is opened which removes the AC from the filter circuit and the DC signal produced thereby from the base electrode of the current control transistor 24. The consequent de-energization of the current control transistor 24 is effective to interrupt the current to the SCR 10 to restore the SCR 10 to a non-conducting state. Accordingly, the circuit is returned to its initial state to await the next closure of either or both of the input switches 42, 52. The diodes 56, 46 are used to isolate switches 42, 52 from each other so that each time control setting is independent of the others. As previously mentioned, the number of inputs and time controls to be exercised by the present invention may be changed from that shown in the illustrated circuit. The resistor R16 is arranged to limit the minimum time for all of the timing controls inasmuch as it is always present in the timing circuit to control the charging of the timing capacitor 28.

Accordingly, it may be seen that there has been provided, an improved timer circuit having a capability for multiple time delay outputs.

The embodiments of the invention in which an exclusive property or privilege is claimed are defined as follows:

1. A timer circuit comprising:
   an output circuit,
   an energizing signal input circuit,
   a current control means connected between said output circuit and said input circuit for selectively controlling a current flow therebetween in response to a control signal,
   time period measuring means for producing an output signal following a predetermined time period,
   control signal means for selectively applying a control signal to said current control means and to said time period measuring means to initiate a measurement of said time period and
   current bypass means connected across said load circuit means and responsive to said output signal for providing a current bypass path in parallel with said load circuit means, said time period measuring means including a plurality of separate time period measuring circuits and said control signal means including a plurality of separately and selectively actuable control circuits connected to respective ones of said time period measuring circuits wherein said time period measuring means each include an RC circuit for developing said output signal dependent on the RC time constant and a unijunction transistor arranged to be triggered into conduction by said RC circuit to produce said output signal.

2. A timer circuit as set forth in claim 1 wherein said energizing signal input circuit and said control signal imeans are both AC powered and include filter circuits for converting the AC power to DC.

3. A timer circuit as set forth in claim 1 wherein said current control means includes a transistor having its emitter-collector path connected to carry the current flow.

4. A timer circuit as set forth in claim 1 wherein said current bypass means includes an SCR having its current conducting electrodes connected to said output circuit and its trigger electrode connected to said time period measuring means to be energized by said output signal.

* * * * *